United States Patent [19]
Fujihara et al.

[11] Patent Number: 5,949,808
[45] Date of Patent: *Sep. 7, 1999

[54] SEMICONDUCTOR LASER AND METHOD FOR PRODUCING THE SAME

[75] Inventors: Kiyoshi Fujihara, Katano; Yoshihiro Mori, Hirakata, both of Japan

[73] Assignee: Matsushita Electric Industrial Co., Ltd., Osaka, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/684,385

[22] Filed: Jul. 19, 1996

[30] Foreign Application Priority Data

Jul. 21, 1995 [JP] Japan .................... 7-185213

[51] Int. Cl.⁶ .................... H01S 3/19
[52] U.S. Cl. .................... 372/46
[58] Field of Search .................... 372/46, 48, 36

[56] References Cited

U.S. PATENT DOCUMENTS

| | | | |
|---|---|---|---|
| 4,161,701 | 7/1979 | Takeda et al. | 372/36 |
| 4,542,512 | 9/1985 | Van Den Beemt | 372/46 |
| 5,105,432 | 4/1992 | Murakami et al. | 372/46 |
| 5,107,514 | 4/1992 | Goto | 372/46 |
| 5,245,622 | 9/1993 | Jewell et al. | 372/46 |
| 5,422,901 | 6/1995 | Lebby et al. | 372/46 |
| 5,729,561 | 3/1998 | Hironaka | 372/36 |

FOREIGN PATENT DOCUMENTS

| | | |
|---|---|---|
| 58-190087 | 11/1983 | Japan . |
| 2-305488 | 12/1990 | Japan . |
| 3-263890 | 11/1991 | Japan . |
| 4-35080 | 2/1992 | Japan . |
| 6-260715 | 9/1994 | Japan . |
| 6-350190 | 12/1994 | Japan . |

OTHER PUBLICATIONS

Copy of Office Action dated Sep. 3, 1998 from corresponding Japanese Application No. 8–186466 (with English translation).

Primary Examiner—James W. Davie
Attorney, Agent, or Firm—Ratner & Prestia

[57] ABSTRACT

A semiconductor laser includes a substrate of a first conductive type, a mesa provided on the substrate and having a multilayered structure including at least a cladding layer of the first conductive type, an active layer and another cladding layer of a second conductive type, a current blocking layer provided on both sides of the mesa, a buried layer of the second conductive type provided on the mesa and the current blocking layer, and a contact layer of the second conductive type provided in a predetermined region on the buried layer. The predetermined region does not include a portion immediately above the mesa.

10 Claims, 10 Drawing Sheets

100

600

SEMICONDUCTOR LASER AND METHOD FOR PRODUCING THE SAME

BACKGROUND OF THE INVENTION

1. Field of the Invention

The present invention relates to a semiconductor laser having a mesa structure and capable of realizing stable traverse mode control, and a method for producing such a semiconductor laser.

2. Description of the Related Art

In a semiconductor laser structure, a buried type hetero structure where the periphery of an active layer is filled with a semiconductor material having a large energy gap and a small refractive index has been widely used. The semiconductor laser having such a buried type hetero structure has a low lasing threshold current value and excellent characteristics such as a stable transverse lasing mode so as to be utilized as a light source for optical fiber communication or optical information processing.

An exemplary structure of a conventional semiconductor laser having the buried type hetero structure is shown in FIG. 9.

In the conventional semiconductor laser 50 in FIG. 9, a mesa stripe 20 including an n-InP cladding layer 2, an InGaAsP active layer 3 and a p-InP cladding layer 4 is formed on the surface of an n-InP substrate 1 by etching. Thereafter, a p-InP current blocking layer 5 and an n-InP current blocking layer 6 are grown on the sides of the mesa stripe 20 by a liquid phase epitaxial growth method or vapor phase epitaxial growth method. Furthermore, a p-InP buried layer 7 and a p-InGaAsP contact layer 8 are grown so as to cover the mesa stripe 20 and the current blocking layers 5 and 6, thus forming the buried type hetero structure.

Next, after the entire surface of the thus formed buried type hetero structure is covered with a silicon oxide film 9, the silicon oxide film 9 in a region immediately above the active layer 3 is removed. Then, a p-type electrode 10 is formed in the region where the silicon oxide film 9 has been removed. Furthermore, a metal multilayered film 11 is deposited on the entire surface of the silicon oxide film 9 and the p-type electrode 10. Finally, an n-type electrode 12 is formed on the reverse face of the n-InP substrate 1.

When the thus produced semiconductor laser 50 is actually used, in order to improve heat release characteristics, as shown in FIG. 10, the semiconductor laser 50 is provided in a heat sink 13 with a soldering material 14 in a junction-down direction.

However, in the conventional semiconductor laser 50 having the above-mentioned structure, the silicon oxide film 9 (thermal conductivity: about 0.08 W/cm·K) surrounding the p-type electrode 10 and the underlying contact layer 8 formed of InGaAsP or InGaAs (thermal conductivity: about 0.05 W/cm·K) have lower thermal conductivities than InP (thermal conductivity: about 0.6 W/cm·K) forming the cladding layer 4. As a result, the layers 8 and 9 function as a barrier against thermal conduction so that heat generated between the p-type electrode 10 and the active layer 3 cannot be efficiently released to the heat sink 13.

Such a phenomenon in the heat release characteristic does not cause a serious problem during a low bias driving state with a driving current of, for example, about 100 mA. However, the phenomenon causes light output to be significantly saturated during a high bias driving state with a driving current of, for example, about 500 mA, thus adversely affecting the operating characteristics of the semiconductor laser.

SUMMARY OF THE INVENTION

A semiconductor laser according to the present invention includes a substrate of a first conductive type; a mesa provided on the substrate and having a multilayered structure including at least a cladding layer of the first conductive type, an active layer and another cladding layer of a second conductive type; a current blocking layer provided on both sides of the mesa; a buried layer of the second conductive type provided on the mesa and the current blocking layer; and a contact layer of the second conductive type provided in a predetermined region on the buried layer. The predetermined region does not include a portion immediately above the mesa.

According to another aspect of the invention, a semiconductor laser includes a substrate of a first conductive type; a mesa provided on the substrate and having a multilayered structure including at least a cladding layer of the first conductive type, an active layer and another cladding layer of a second conductive type; a current blocking layer provided on both sides of the mesa; a buried layer of the second conductive type provided on the mesa and the current blocking layer; and a contact layer of the second conductive type provided in a cavity direction with a predetermined pitch on the buried layer, and being stripe-shaped in a direction perpendicular to the cavity direction.

According to another aspect of the invention, a semiconductor laser includes a substrate of a first conductive type; a mesa provided on the substrate and having a multilayered structure including at least a cladding layer of the first conductive type, an active layer and another cladding layer of a second conductive type; a current blocking layer provided on both sides of the mesa; and a buried layer of the second conductive type provided on the mesa and the current blocking layer. A concave portion is provided in a region on the substrate immediately below the mesa, and a layer made of a material with a high thermal conductivity is provided in the concave portion.

According to another aspect of the invention, a method for producing a semiconductor laser includes the steps of: providing a buried type hetero structure including a striped active layer parallel to a cavity direction and a contact layer of a second conductive type as an uppermost layer on a substrate of a first conductive type; masking a second region on the contact layer other than a first region immediately above the active layer with a insulator film; etching the contact layer in the first region; removing the insulator film; and forming an electrode in the second region on the contact layer.

According to another aspect of the invention, a method for producing a semiconductor laser includes the steps of: providing a buried type hetero structure including a striped active layer parallel to a cavity direction and a contact layer of a second conductive type as an uppermost layer on a substrate of a first conductive type; forming a striped mask in a direction perpendicular to the cavity direction with an insulator film on the contact layer; etching the contact layer using the mask; removing the mask; and forming an electrode on the contact layer.

According to another aspect of the invention, a method for producing a semiconductor laser includes the steps of: providing a mesa having a multilayered structure including at least a cladding layer of a first conductive type, an active layer and another cladding layer of a second conductive type on a substrate of the first conductive type; sequentially depositing a current blocking layer, a buried layer of the second conductive type and a contact layer of the second conductive type on both sides of the mesa; providing a buried layer of the second conductive type on the mesa; and forming an electrode on the contact layer.

According to another aspect of the invention, a method for producing a semiconductor laser includes the steps of: providing a buried type hetero structure including a striped active layer parallel to a cavity direction and a contact layer of a second conductive type as an uppermost layer on a substrate of a first conductive type; providing a concave portion in a region on the substrate immediately below the active layer; and burying a layer made of a material with a high thermal conductivity in the concave portion.

Thus, the invention described herein makes possible the advantages of (1) providing a semiconductor laser having an improved heat release characteristic and thus reduced saturation of light output during high bias driving and (2) providing a method for producing such a semiconductor laser.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of various embodiments with reference to the accompanying drawings.

First Embodiment

The structure of a semiconductor laser 100 according to a first embodiment of the present invention and a production method thereof will be described with reference to FIGS. 1A to 1D and 2.

Figure 1A:
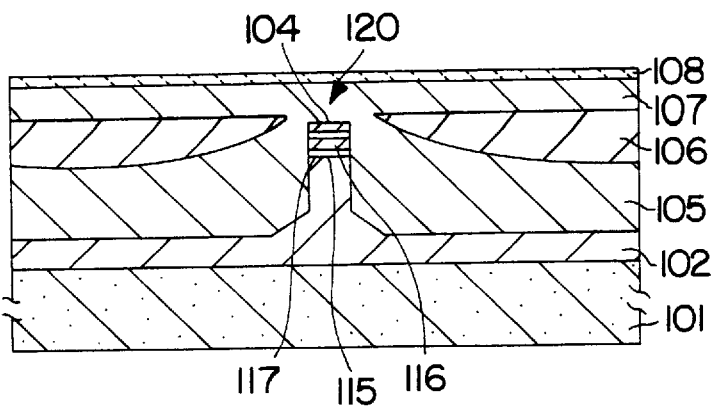
FIGS. 1A to 1D are cross sectional views illustrating a production process of a semiconductor laser in a first embodiment of the present invention.

As shown in FIG. 1A, an n-InP cladding layer 102 with a thickness of about 5 $\mu$m, an n-InGaAsP optical waveguide layer 115 with a thickness of about 500 nm, a multi-quantum well active layer 116 formed of 5 pairs of InGaAsP well layer with a thickness of about 5 nm and an InGaAsP barrier layer with a thickness of about 10 nm, a p-InGaAsP optical waveguide layer 117 with a thickness of about 500 nm and a p-InP cladding layer 104 with a thickness of about 0.5 $\mu$m are epitaxially grown on an n-InP substrate 101 sequentially to form a semiconductor multilayered structure. Thereafter, a mesa stripe 120 with a width of 2 $\mu$m is formed by photolithograph and etching. Then, a p-InP current blocking layer 105 and an n-InP current blocking layer 106 are grown on the sides of the mesa stripe 120 by a liquid phase epitaxial growth method. Furthermore, a p-InP buried layer 107 and a p-InGaAsP contact layer 108 are grown so as to cover the mesa stripe 120 and the current blocking layers 105 and 106, thus forming a buried type hetero structure.

Figure 1B:
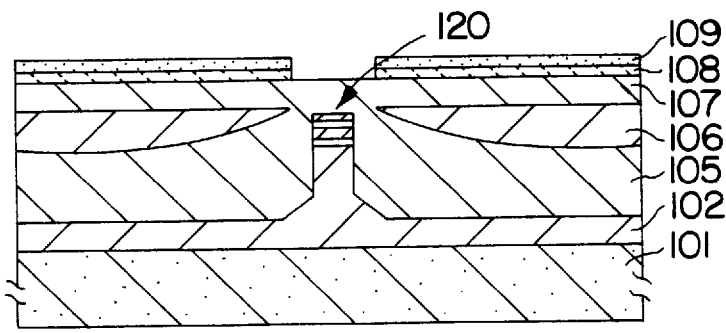

Furthermore, a silicon oxide film ($SiO_2$) 109 with a thickness of about 0.15 $\mu$m is deposited on the contact layer 108, and the silicon oxide film 109 in the region immediately above the mesa stripe 120 is removed using a resist mask with a suitable pattern. Thereafter, an exposed portion on the p-InGaAsP contact layer 108 is further removed by etching using a sulfuric acid type etchant. Thus, as shown in FIG. 1B, an opening is formed in the region in the contact layer 108 (and the silicon oxide film 109) immediately above the mesa stripe 120.

It is preferable that a width of the portion in the p-InGaAsP contact layer 108 to be removed by etching is about twice to about ten times the width of the mesa stripe 120 (i.e., the width of the active layer 116). In the case where the width of the opening in the contact layer 108 is smaller than about twice the width of the mesa stripe 120, a sufficient heat release effect cannot be obtained when the semiconductor laser 100 is bonded to the heat sink 113 in the junction-down direction. On the other hand, when the width of the opening in the contact layer 108 is larger than about ten times the width of the mesa stripe 120, although it is effective in terms of heat release for preventing the temperature of the active layer 116 from rising, a distance between the contact layer 108 and the active layer 116 is extended. Thus, resistance therebetween is increased. As a result, the amount of heat generation is increased, thus causing saturation of laser output.

Figure 11:
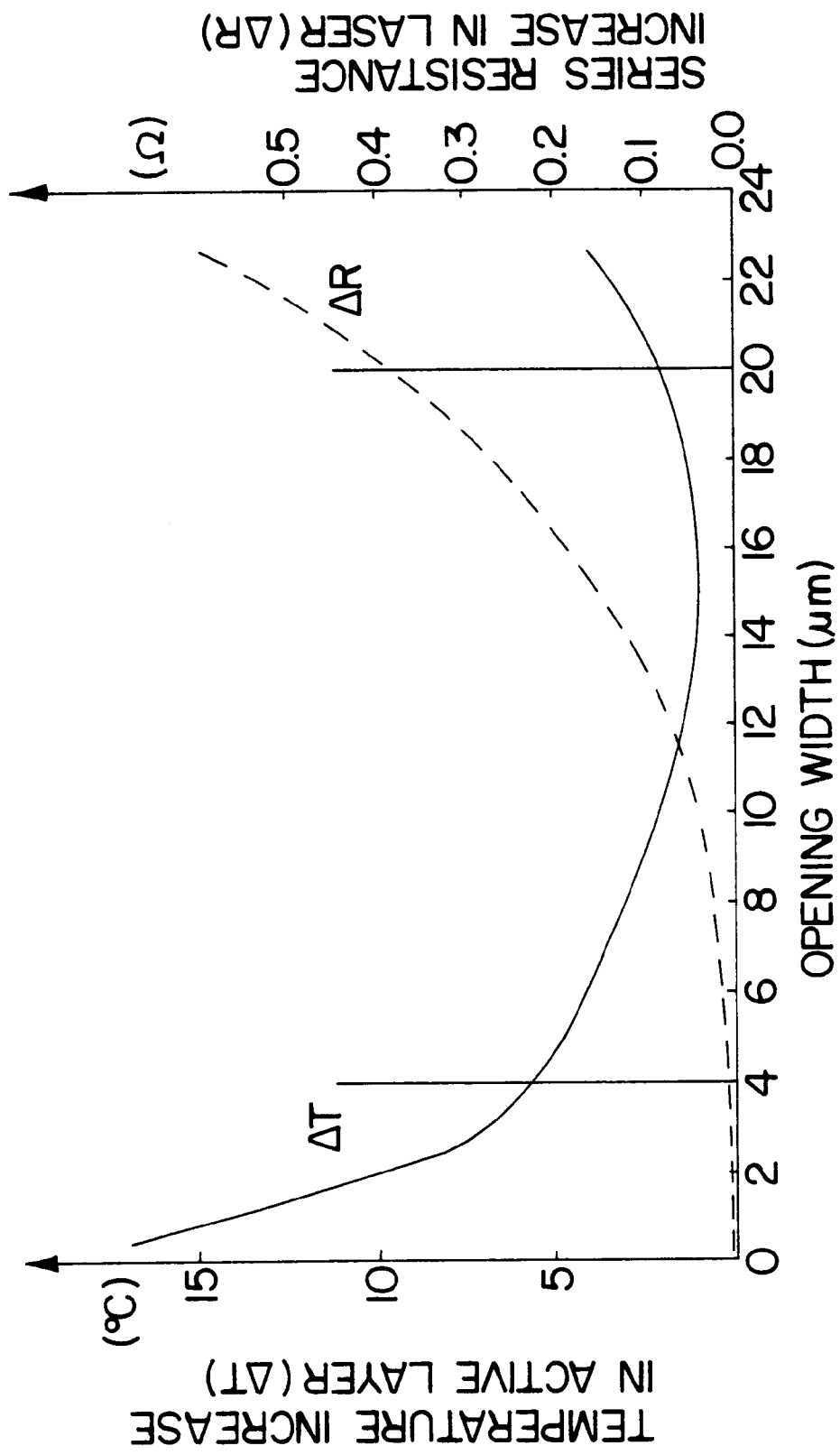
FIG. 11 is a graph showing changes including an increase ($\Delta T$) in temperature in an active layer and an increase ($\Delta R$) in resistance between a contact layer and the active layer with respect to a width of an opening in the contact layer.

FIG. 11 shows changes of an increase in temperature ($\Delta T$) of the active layer 116 and an increase in resistance ($\Delta R$) between the contact layer 108 and the active layer 116 with respect to a width of an opening of the contact layer 108 (abscissa), in the case where the width of the mesa stripe 120 (i.e., the width of the active layer 116) is about 2 $\mu$m. When the width of the opening is about 4 $\mu$m (i.e, smaller than about twice the width of the mesa stripe 120), the increase in the temperature ($\Delta T$) of the active layer 116 is significant. On the other hand, when the width of the opening is about 20 $\mu$m (i.e, larger than about ten times the width of the mesa stripe 120), the increase in resistance ($\Delta R$) between the contact layer 108 and the active layer 116 is significant.

Figure 1C:
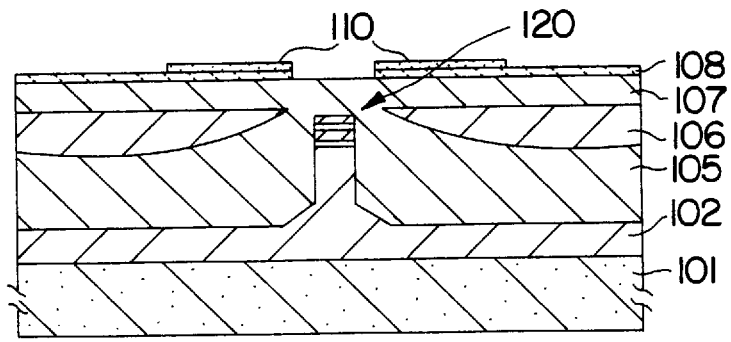

After the opening is formed in the contact layer 108 as described above, the silicon oxide film 109 is removed. Then, resist is coated on the entire surface of the contact layer 108, and suitably patterned by photolithograph. Then, an alloy film of gold and zinc or a metal multilayered film of gold/zinc/gold is deposited on the p-InGaAsP contact layer 108 in the vicinity of the region immediately above the mesa stripe 120, using the thus patterned resist as a mask. Furthermore, lift-off and annealing at about 350° C. are performed to form two striped p-type electrodes 110, as shown in FIG. 1C.

Figure 1D:
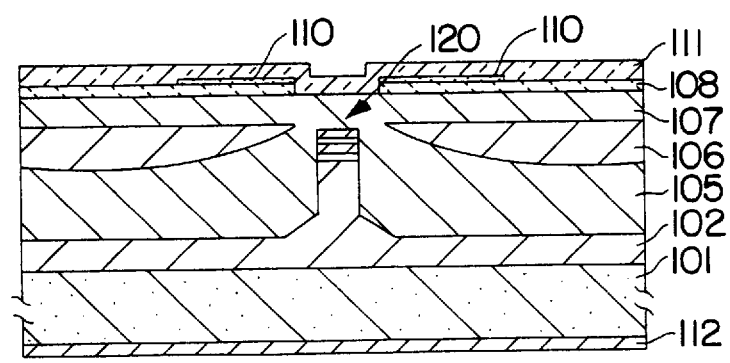

Then, as shown in FIG. 1D, a metal multilayered film 111 formed of titanium, platinum and gold is deposited so as to cover the p-type electrodes 110 and the contact layer 108. Titanium is used because it has high adhesion to a semiconductor material. Other metals such as chrome having satisfactory adhesion can be used. Platinum is used to prevent gold from diffusing to the inside of the semiconductor material. The layer can be thinner or other metal materials can be used, as long as this requirement is satisfied.

Finally, an n-type electrode 112 formed of gold, tin, chrome, platinum and gold is formed on the reverse face of the n-InP substrate 101, thus completing the semiconductor laser 100.

Figure 2:
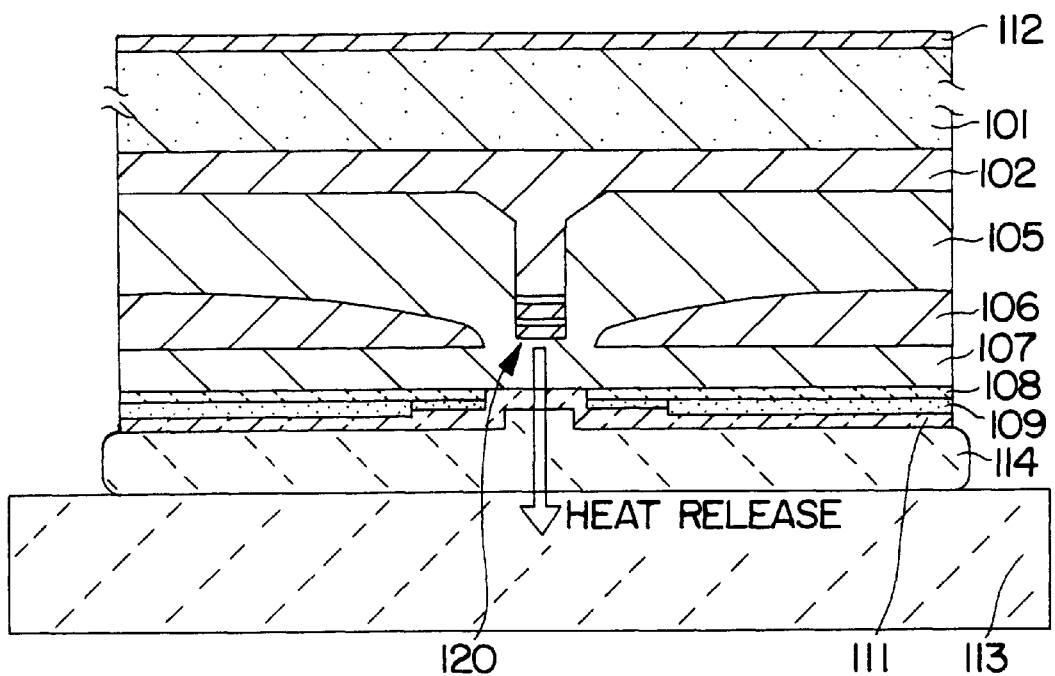
FIG. 2 is a cross sectional view illustrating a state where the semiconductor laser shown in FIG. 1 is attached to a heat sink.

As shown in FIG. 2, the thus produced semiconductor laser 100 is bonded to a heat sink 113 with a soldering material 114 in the same manner as in the case of the conventional example. At this time, according to the present invention, the heat generated inside the semiconductor laser 100 is released without being shielded by the contact layer 108 or the silicon oxide film (insulator film) 109. As a result, a satisfactory operating characteristic with little saturation of light output can be realized even during high bias driving.

In the aforementioned description, the current blocking layer is formed by a liquid phase epitaxial growth method, but the same effect can be obtained by using a vapor phase epitaxial growth method. The current blocking layers 105 and 106 are formed of InP, but any material can be used as long as it has a larger energy gap than the active layer 116. For example, InGaAsP can be used. Alternatively, a semi-insulator layer can be used.

Second Embodiment

The structure of a semiconductor laser 200 according to a second embodiment of the present invention and a production method thereof will be described with reference to FIGS. 3A to 3D.

In the previously described first embodiment, after an alloy film of gold and zinc or a metal multilayered film of gold/zinc/gold is deposited, lift-off so as to cover the p-type electrodes 110 and the and annealing at about 350° C. are performed to form a layer alloyed with a semiconductor material and obtain ohmic contact. The thus produced electrode is an alloy electrode. In such an alloy electrode, unless the contact layer has a thickness of about 0.5 $\mu$m or more, the defects generated in the alloy layer may deteriorate the life of the semiconductor laser. However, since the thermal conductivity of InGaAsP, a component material of the contact layer, is small, it is preferable that the contact layer 108 will be as thin as possible for heat release.

Accordingly, in the semiconductor laser 200 of the present embodiment, by using a non-alloy electrode which is unlikely to be alloyed with the semiconductor material, the heat release characteristic of the semiconductor laser is further improved.

Figure 3A:
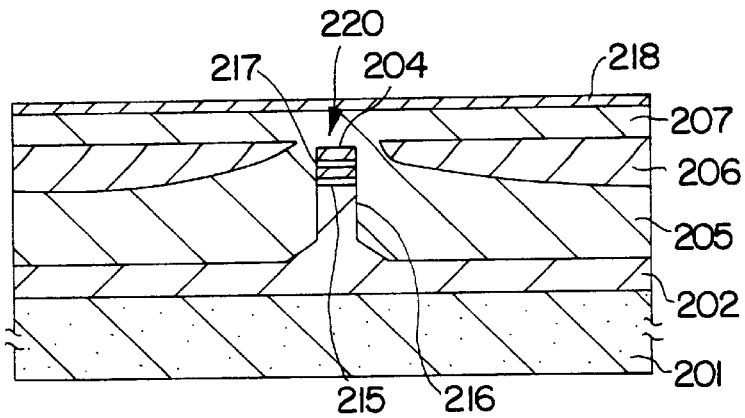
FIGS. 3A to 3D are cross sectional views illustrating a production process of a semiconductor laser in a second embodiment of the present invention.

As shown in FIG. 3A, an n-InP cladding layer 202 with a thickness of about 5 $\mu$m, an n-InGaAsP optical waveguide layer 215 with a thickness of about 500 nm, a multi-quantum well active layer 216 formed of 5 pairs of InGaAsP well layer with a thickness of about 5 nm and an InGaAsP barrier layer with a thickness of about 10 nm, a p-InGaAsP optical waveguide layer 217 with a thickness of about 500 nm and a p-InP cladding layer 204 with a thickness of about 0.5 $\mu$m are epitaxially grown on an n-InP substrate 201 sequentially to form a semiconductor multilayered structure. Thereafter, a mesa stripe 220 with a width of 2 $\mu$m is formed by photolithograph and etching. Then, a p-InP current blocking layer 205 and an n-InP current blocking layer 206 are grown on the sides of the mesa stripe 220 by a liquid phase epitaxial growth method. Furthermore, a p-InP buried layer 207 and a p-InGaAs contact layer 218 are grown so as to cover the mesa stripe 220 and the current blocking layers 205 and 206, thus forming a buried type hetero structure.

As a component material of the contact layer 218, p-InGaAs is used instead of p-InGaAsP used in the first embodiment, because the band gap of p-InGaAs is smaller and therefore the ohmic contact is more easily obtained.

Figure 3B:
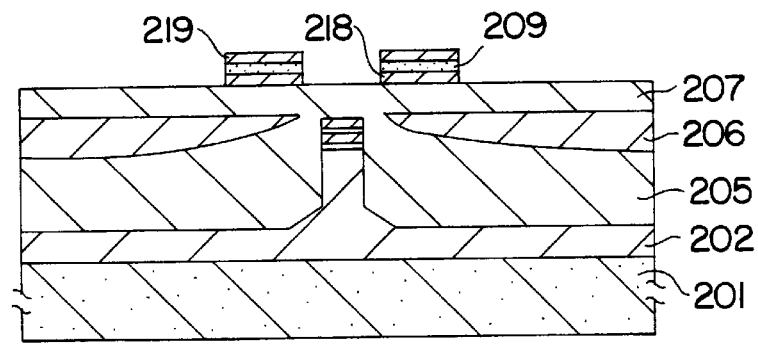

Furthermore, a silicon oxide film 209 with a thickness of about 0.15 $\mu$m is deposited on the contact layer 218. Then, two striped masks 219 are symmetrically formed using a resist with the mesa stripe 220 including the active layer 216 interposed therebetween. Then the silicon oxide film 209 is patterned using the striped masks. Thereafter, an exposed portion of the contact layer 218 is removed by etching using a sulfuric acid type etchant. Thus, as shown in FIG. 3B, the two symmetric striped contact layers 218 are formed with the mesa stripe 220 including the active layer 216 interposed therebetween.

Figure 3C:
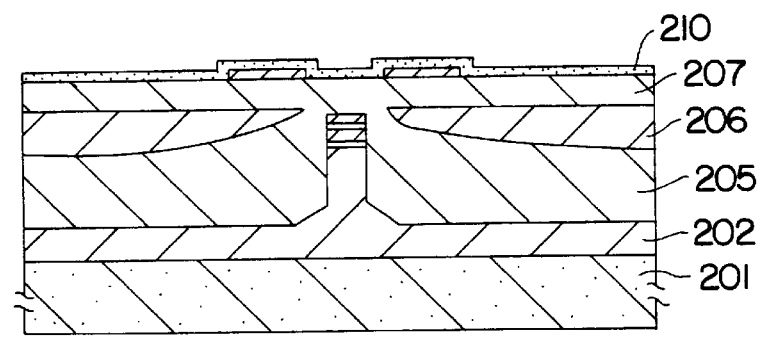

After the contact layer 218 is patterned in stripes as described above, the striped masks 219 and the silicon oxide film 209 are removed. Then, a metal multilayered film formed of titanium and platinum is deposited so as to cover the entire surface of the buried layer 207 and the contact layer 218. Then, annealing at about 450° C. is performed to form p-type electrode 210, as shown in FIG. 3C. Herein, ohmic contact with the p-type electrode 210 can be obtained only on the p-InGaAs contact layer 218. In the other regions, the buried layer 207 formed of p-InP is in direct contact with the p-type electrode 210. However, since the p-type electrode 210 in the present embodiment is an non-alloy electrode, generation of stress due to alloying and diffusion of metal to the inside of the semiconductor material scarcely occur. Thus, these phenomena do not cause deterioration in operating characteristics of the semiconductor laser.

Figure 3D:
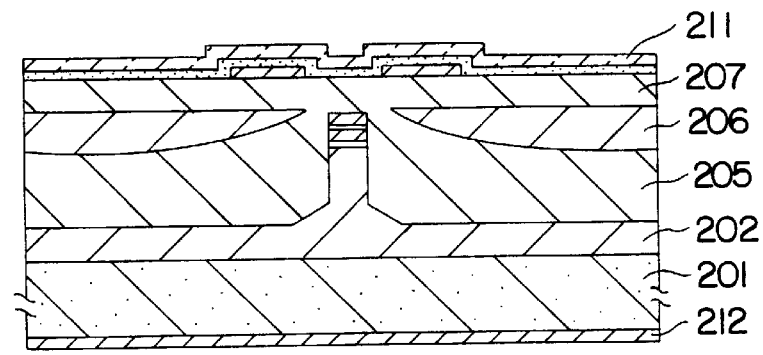

Then, as shown in FIG. 3D, a metal multilayered film 211 formed of titanium, platinum and gold is deposited so as to cover the p-type electrode 210. Finally, an n-type electrode 212 formed of gold, tin, chrome, platinum and gold is formed on the reverse face of the n-InP substrate 201, thus completing the semiconductor laser 200.

The thus produced semiconductor laser 200 is bonded to a heat sink with a soldering material in the same manner as in the case of the semiconductor laser 100 of the first embodiment. At this time, the heat generated inside the semiconductor laser 200 is efficiently released as in the first embodiment. As a result, satisfactory operating characteristics such as little saturation of light output can be realized even during high bias driving. In particular, since the p-InGaAs contact layer 218 in the portions other than the portion for obtaining ohmic contact is removed by etching in the semiconductor laser 200 in the present embodiment, the heat release characteristic is further improved.

Third Embodiment

The structure of a semiconductor laser 300 according to a third embodiment of the present invention and a production method thereof will be described with reference to FIGS. 4A to 4E. FIGS. 4B to 4D are cross sectional views taken along a line A-A' in FIG. 4A.

In the structures of the semiconductor lasers 100 and 200 in the first and second embodiments described above, the p-type electrode 110 or 210 does not exist immediately above the mesa stripe 120 or 220. Thus, current is diagonally injected into the active layer 116 or 216. As a result, electrical resistance between the p-type electrode 110 or 210 and the active layer 116 or 216 is slightly increased. In the semiconductor laser 300 of the present embodiment, the heat characteristic is improved by suppressing such an increase in the electrical resistance.

Figure 4A:
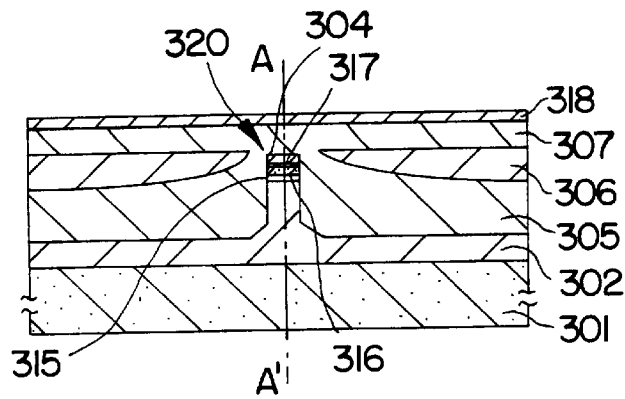
FIG. 4A is a cross sectional view illustrating a production process of a semiconductor laser in a third embodiment of the present invention.
Figure 4B:
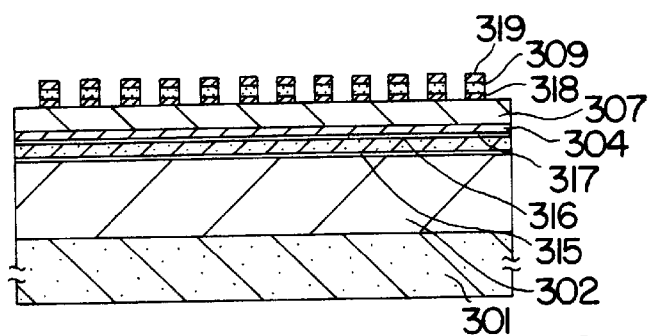
FIGS. 4B to 4D are cross sectional views illustrating further production processes of the semiconductor taken along a line A-A' in FIG. 4A.
Figure 4C:
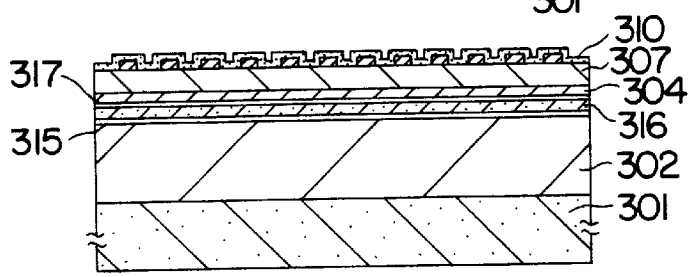
Figure 4D:
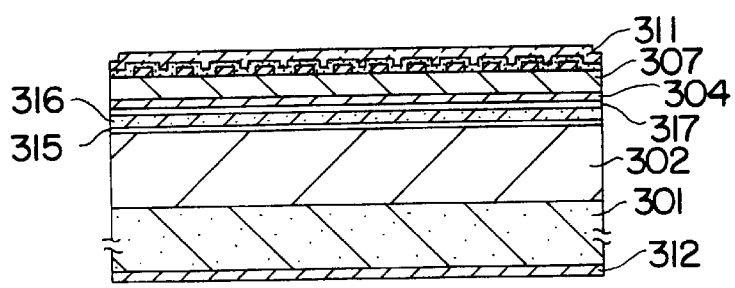
Figure 4E:
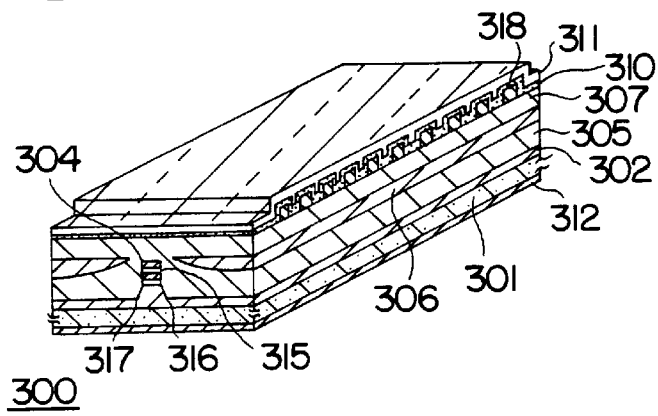
FIG. 4E is a perspective view illustrating the structure of the semiconductor laser in the third embodiment of the present invention.

As shown in FIG. 4A, an n-InP cladding layer 302 with a thickness of about 5 μm, an n-InGaAsP optical waveguide layer 315 with a thickness of about 500 nm, a multi-quantum well active layer 316 formed of 5 pairs of InGaAsP well layer with a thickness of about 5 nm and an InGaAsP barrier layer with a thickness of about 10 nm, a p-InGaAsP optical waveguide layer 317 with a thickness of about 500 nm and a p-InP cladding layer 304 with a thickness of about 0.5 μm are epitaxially grown on an n-InP substrate 301 sequentially to form a semiconductor multilayered structure. Thereafter, a mesa stripe 320 with a width of 2 μm is formed by photolithograph and etching. Then, a p-InP current blocking layer 305 and an n-InP current blocking layer 306 are grown on the sides of the mesa stripe 320 by a liquid phase epitaxial growth method. Furthermore, a p-InP buried layer 307 and a p-InGaAs contact layer 318 are grown so as to cover the mesa stripe 320 and the current blocking layers 305 and 306, thus forming a buried type hetero structure.

Furthermore, a silicon oxide film 309 with a thickness of about 0.15 μm is deposited on the contact layer 318. Then, a plurality of striped masks 319 having a width of about 5 μm are formed with a predetermined gap, e.g., a gap of about 3 μm so as to be orthogonal to the direction of a cavity using a resist. Then, the silicon oxide film 309 is etched to a predetermined pattern, using the striped masks 319. Thereafter, exposed portions of the contact layer 318 are removed by etching using a sulfuric acid type etchant. Thus, as shown in FIG. 4B, a plurality of striped openings are formed in the contact layers 318 (and the silicon oxide film 309) with a gap of about 3 μm.

After the openings are formed in the contact layers 318 as described above, the striped masks 319 and the silicon oxide film 309 are removed. Then, a metal multilayered film formed of titanium and platinum is deposited so as to cover the entire surface of the buried layer 307 and the contact layer 318. Then, annealing at about 450° C. is performed to form p-type electrode 310, as shown in FIG. 4C.

Then, as shown in FIG. 4D, a metal multilayered film 311 formed of titanium, platinum and gold is deposited so as to cover the p-type electrode 310. Finally, an n-type electrode 312 formed of gold, tin, chrome, platinum and gold is formed on the reverse face of the n-InP substrate 301, thus completing the semiconductor laser 300 having the structure as shown in the perspective view of FIG. 4E.

The thus produced semiconductor laser 300 is bonded to a heat sink with a soldering material in the same manner as in the cases of the semiconductor lasers 100 and 200 of the first and second embodiments. At this time, the heat generated inside the semiconductor laser 300 is efficiently released as in the first and second embodiments. As a result, satisfactory operating characteristics such as little saturation of light output can be realized even during high bias driving. Furthermore, in the semiconductor laser 300 in the present embodiment, the heat release characteristic can be improved without increasing the electrical resistance between the p-type electrode 310 and the active layer 316.

In the aforementioned description, the gap (hereinafter, referred to as W1) of the adjacent contact layers 318 formed in stripes is about 3 μm, and the width (hereinafter, referred to as W2) of the contact layer 318 is about 5 μm. Alternatively, it is possible to set W1 and W2 to other values. In this case, it is desirable to set W1 and W2 to such a width and gap that current is uniformly injected from the contact layer 318 to the active layer 316. Unless current is uniformly injected into the active layer 316, light is not efficiently emitted.

More specifically, it is desirable that the gap W1 of the contact layers 318 will be smaller than a distance (d) from the contact layer 318 to the active layer 316 (W1<d) and that the width W2 of the contact layer 318 will be larger than the gap W1 (W2>W1). For example, when d is about 2.5 μm, W1 and W2 can be set as follows: W1=about 2 μm and W2=about 5 μm.

Fourth Embodiment

The structure of a semiconductor laser 400 according to a fourth embodiment of the present invention and a production method thereof will be described with reference to FIGS. 5A to 5C.

In the present embodiment, the heat release characteristic is improved by suppressing an increase in electrical resistance from the p-type electrode to the active layer. More specifically, the increase in the electrical resistance is suppressed by shortening the distance from the p-type electrode to the active layer.

Figure 5A:
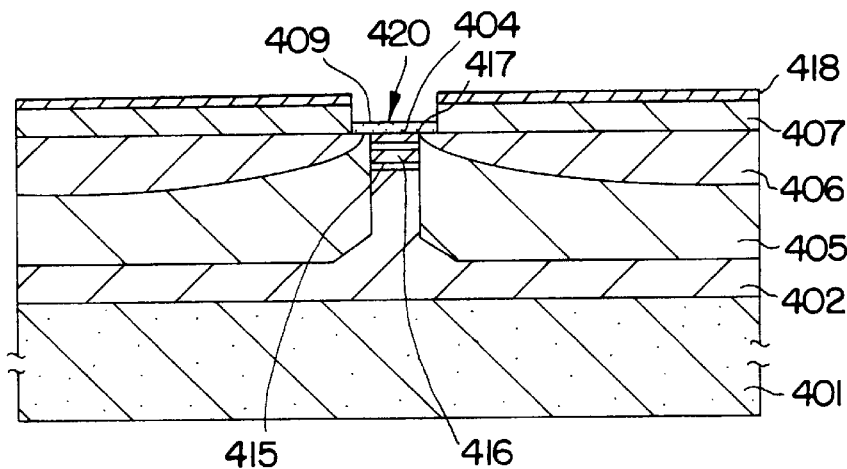
FIGS. 5A to 5C are cross sectional views illustrating a production process of a semiconductor laser in a fourth embodiment of the present invention.
Figure 5B:
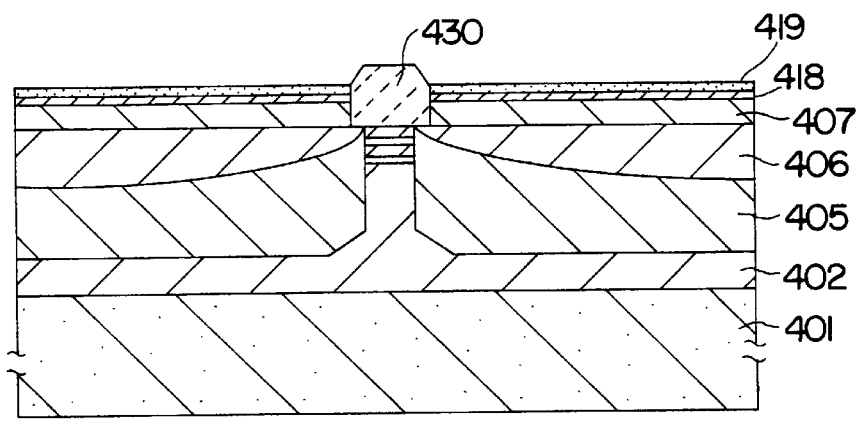
Figure 5C:
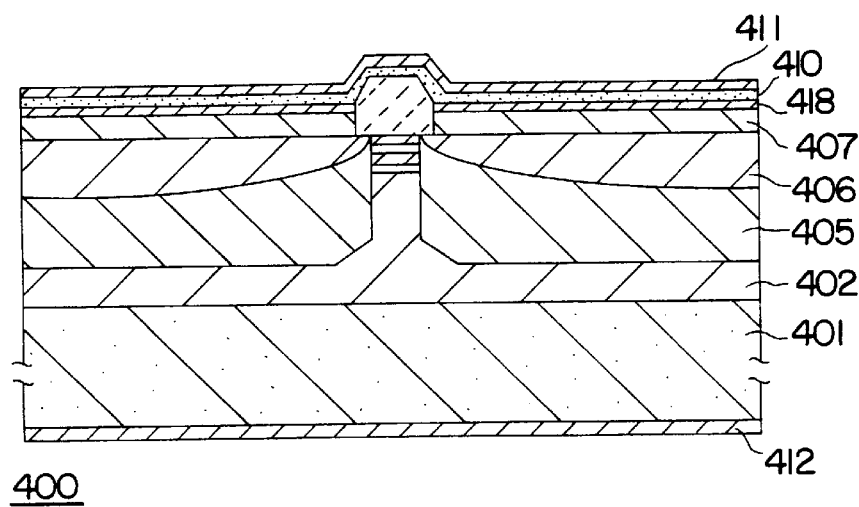

As shown in FIG. 5A, an n-InP cladding layer 402 with a thickness of about 5 μm, an n-InGaAsP optical waveguide layer 415 with a thickness of about 500 nm, a multi-quantum well active layer 416 formed of 5 pairs of InGaAsP well layer with a thickness of about 5 nm and an InGaAsP barrier layer with a thickness of about 10 nm, a p-InGaAsP optical waveguide layer 417 with a thickness of about 500 nm and a p-InP cladding layer 404 with a thickness of about 0.5 μm are epitaxially grown on an n-InP substrate 401 sequentially to form a semiconductor multilayered structure. Thereafter, a mesa stripe 420 with a width of 2 μm is formed by photolithograph and etching. Then, a p-InP current blocking layer 405 and an n-InP current blocking layer 406 are grown on the sides of the mesa stripe 420 by a vapor phase epitaxial growth method. Furthermore, after silicon oxide film 409 is formed in stripes in a region including a portion immediately above the mesa stripe 420, a p-InP buried layer 407 and a p-InGaAs contact layer 418 are grown in regions other than the regions masked by the silicon oxide film 409 so as to cover the current blocking layer 406, thus forming a buried type hetero structure.

Then, after the silicon oxide film 409 previously formed is removed, another silicon oxide film 419 is deposited on the contact layer 418. Using the silicon oxide film 419 as a mask, a p-InP buried layer 430 is grown in a region which is not masked immediately above the mesa stripe 420 by a vapor phase epitaxial growth method, as shown in FIG. 5B.

Thereafter, the silicon oxide film 419 is removed, and a metal multilayered film formed of titanium and platinum is deposited so as to cover the entire surface of the buried layer 430 and the contact layer 418. Then, annealing at about 450° C. is performed to form p-type electrode 410. Then, a metal multilayered film 411 formed of titanium, platinum and gold is deposited so as to cover the p-type electrode 410. Finally, an n-type electrode 412 formed of gold, tin, chrome, platinum and gold is formed on the reverse face of the n-InP substrate 401, thus completing the semiconductor laser 400, as shown in FIG. 5C.

The thus produced semiconductor laser 400 is bonded to a heat sink with a soldering material in the same manner as in the cases of the semiconductor lasers 100, 200 and 300 of the first, second and third embodiments. At this time, the heat generated inside the semiconductor laser 400 is efficiently released as in the first, second and third embodiments. As a result, satisfactory operating characteristics such as little saturation of light output can be realized even during high bias driving. In particular, in the semiconductor laser 400 in the present embodiment, the convex buried layer 430 is formed in the region immediately above the mesa stripe 420. When the semiconductor laser 400 is attached to the heat sink, the convex buried layer is pushed onto the soldering material. Thus, the soldering material sufficiently adheres to the upper face of the semiconductor laser 400, thus making it unlikely to generate voids therebetween. As a result, the deterioration in operating characteristics of the semiconductor laser after assembly can be prevented.

Fifth Embodiment

The structure of a semiconductor laser 500 according to a fifth embodiment of the present invention and a production method thereof will be described with reference to FIGS. 6A to 6D and 7.

In the semiconductor laser 500 of the present embodiment, the heat release characteristic is further improved by making it possible to release heat from the substrate side.

Figure 6A:
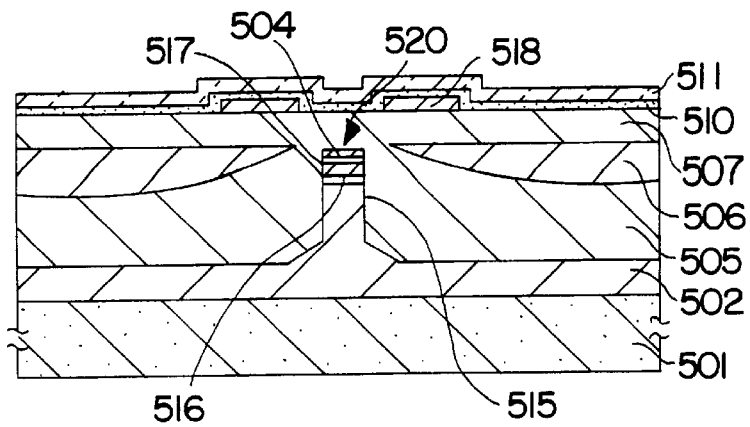
FIGS. 6A to 6D are cross sectional views illustrating a production process of a semiconductor laser in a fifth embodiment of the present invention.

As shown in FIG. 6A, an n-InP cladding layer 502 with a thickness of about 5 $\mu$m, an n-InGaAsP optical waveguide layer 515 with a thickness of about 500 nm, a multi-quantum well active layer 516 formed of 5 pairs of InGaAsP well layer with a thickness of about 5 nm and an InGaAsP barrier layer with a thickness of about 10 nm, a p-InGaAsP optical waveguide layer 517 with a thickness of about 500 nm and a p-InP cladding layer 504 with a thickness of about 0.5 $\mu$m are epitaxially grown on an n-InP substrate 501 sequentially to form a semiconductor multilayered structure. Thereafter, a mesa stripe 520 with a width of 2 $\mu$m is formed by photolithograph and etching. Then, a p-InP current blocking layer 505 and an n-InP current blocking layer 506 are grown on the sides of the mesa stripe 520 by a liquid phase epitaxial growth method. Furthermore, a p-InP buried layer 507 and a p-InGaAs contact layer 518 are grown so as to cover the mesa stripe 520 and the current blocking layers 505 and 506, thus forming a buried type hetero structure.

Furthermore, a silicon oxide film with a thickness of about 0.15 $\mu$m is deposited on the contact layer 518. Then, two striped masks are symmetrically formed using a resist with the mesa stripe 520 including the active layer 516 interposed therebetween. Then, the silicon oxide film is patterned using the striped masks. Thereafter, exposed portions of the contact layer 518 are removed by etching using a sulfuric acid type etchant. Thus, the two symmetric striped contact layers 518 are formed with the mesa stripe 520 including the active layer 516 interposed therebetween.

As described above, after the contact layers 518 are patterned in stripes, the striped masks and the silicon oxide film are removed. Then, a metal multilayered film formed of titanium and platinum is deposited so as to cover the entire surface of the buried layer 507 and the contact layer 518. Then, annealing at about 450° C is performed to form p-type electrode 510. Then, a metal multilayered film 511 formed of titanium, platinum and gold is deposited so as to cover the p-type electrode 510. Thus the structure as shown in FIG. 6A can be obtained.

Figure 6B:
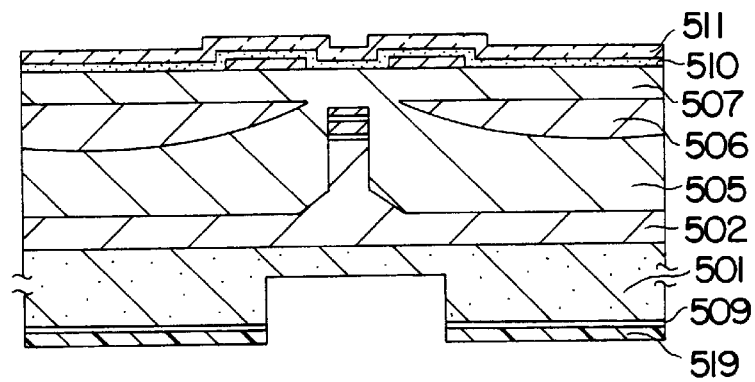

Then, as shown in FIG. 6B, after a silicon oxide film 509 is deposited on the reverse face of the substrate 501, a resist mask 519 with a predetermined pattern is formed on the silicon oxide film 509. Then, using the resist mask 519, the silicon oxide film 509 in the region immediately below the active layer 516 is removed. Furthermore, the n-InP substrate 501 is etched by about 50 $\mu$m by a hydrochloric acid type etchant.

The resist mask 519 and the silicon oxide film 509 are removed. Then, the n-InP substrate 501 is etched using a mixed solution of hydrochloric acid and nitric acid so as to obtain a thickness which makes it easy to cut out chips along a cleavage plane. At this time, the region immediately below the active layer 516 is 50 $\mu$m thinner than other regions as a result of the previous etching prior to the wet etching. In view of the nature of wet etching, the difference in thickness can be maintained. In wet etching, a concave portion is more easily etched than flat regions. Accordingly, in the case where the substrate 501 is etched to a thickness of about 100 $\mu$m as a whole, the thickness of the region in the substrate 501 immediately below the active layer 516 becomes about 40 $\mu$m or less.

Figure 6C:
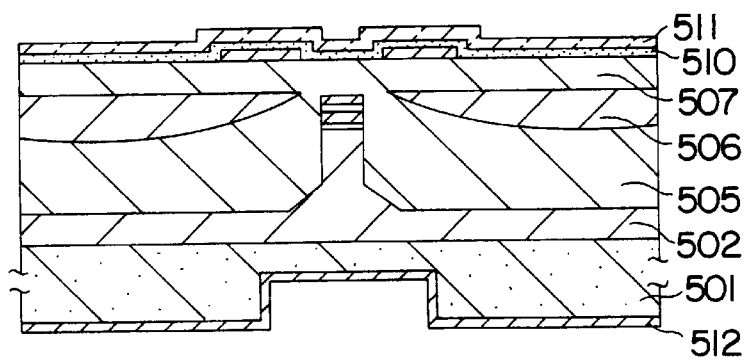

Next, as shown in FIG. 6C, an n-type electrode 512 formed of gold, tin, chrome, platinum and gold is formed on the entire reverse face of the etched substrate 501.

Figure 6D:
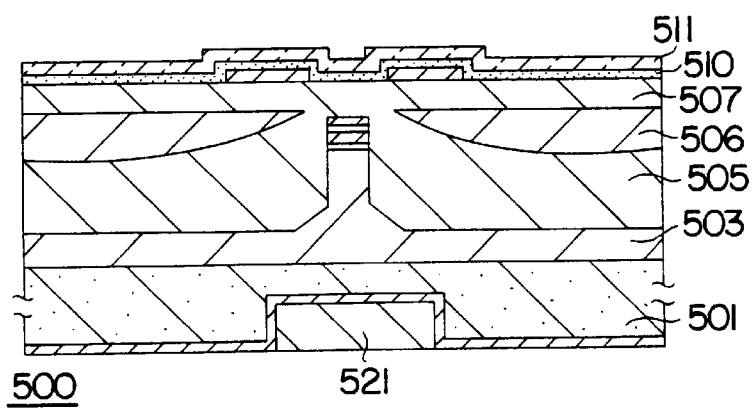

Furthermore, the reverse face of the substrate 501 except the concave portion (i.e, the groove like portion) immediately below the active layer 516 is covered with a resist mask, and gold plating is performed. Thus, the gold-plated layer 521 is buried in the concave portion in the substrate 501, as shown in FIG. 6D.

Figure 7:
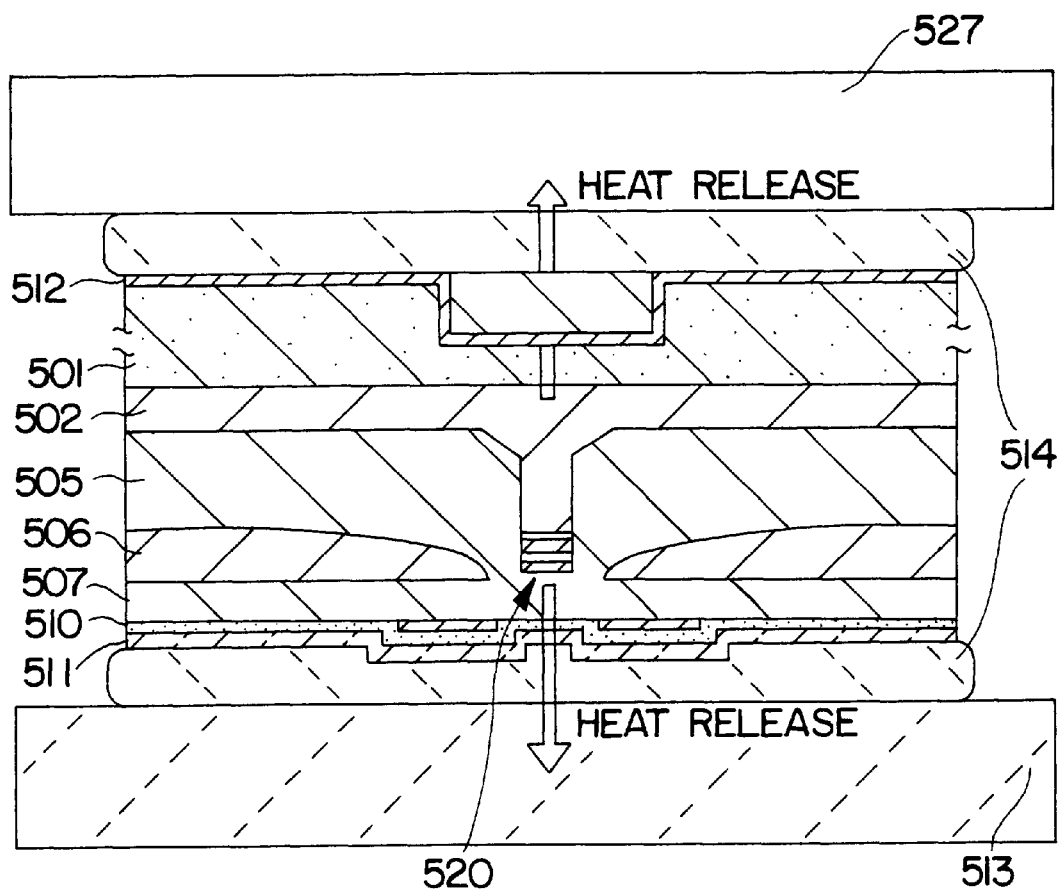
FIG. 7 is a cross sectional view illustrating a state where the semiconductor laser shown in FIG. 6 is attached to a heat sink.

After chips are cut out from the thus produced wafer, as shown in FIG. 7, the face close to the active layer 516 is attached to a heat sink 513 with a soldering material 514. Alternatively, the substrate 501 is attached to a contact block 527 made of copper having a satisfactory thermal conductivity with the soldering material 514.

In the structure of the above-mentioned semiconductor laser 500 of the present embodiment, since heat can be released both from the heat sink 513 and the contact block 527, the heat release characteristic is further improved, thus making it possible to suppress saturation of output when high bias is reached.

Sixth Embodiment

The structure of a semiconductor laser 600 according to a sixth embodiment of the present invention and a production method thereof will be described with reference to FIGS. 8A to 8D. Although the semiconductor lasers of the previous embodiments are formed on an n-InP substrate, the semiconductor laser 600 of the present embodiment is formed on a p-InP substrate.

Figure 8A:
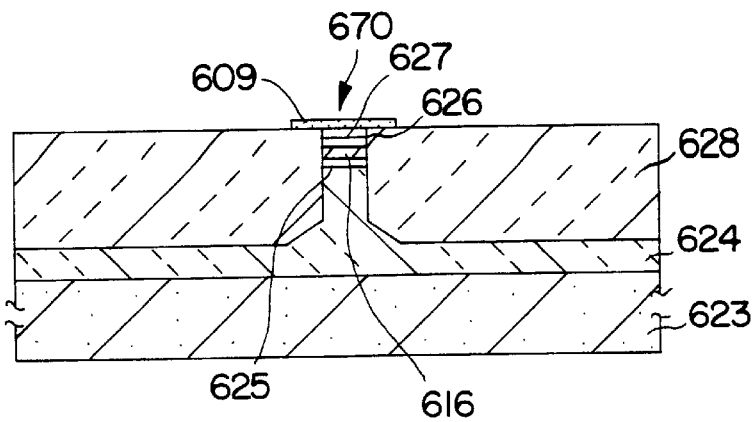
FIGS. 8A to 8D are cross sectional views illustrating a production process of a semiconductor laser in a sixth embodiment of the present invention.

As shown in FIG. 8A, a p-InP cladding layer 624 with a thickness of about 5 $\mu$m, a p-InGaAsP optical waveguide layer 625 with a thickness of about 500 nm, a multi-quantum well active layer 616 formed of 5 pairs of InGaAsP well layer with a thickness of about 5 nm and an InGaAsP barrier layer with a thickness of about 10 nm, an n-InGaAsP optical waveguide layer 626 with a thickness of about 500 nm and an n-InP cladding layer 627 with a thickness of about 0.5 $\mu$m are epitaxially grown on a p-InP substrate 623 sequentially to form a semiconductor multilayered structure. Thereafter, a mesa stripe 670 with a width of 2 $\mu$m is formed by photolithograph and etching using a silicon oxide film 609 as a mask. Then, a semi-insulator InP current blocking layer 628 is grown on the sides of the mesa stripe 670 by a vapor phase epitaxial growth method.

Figure 8B:
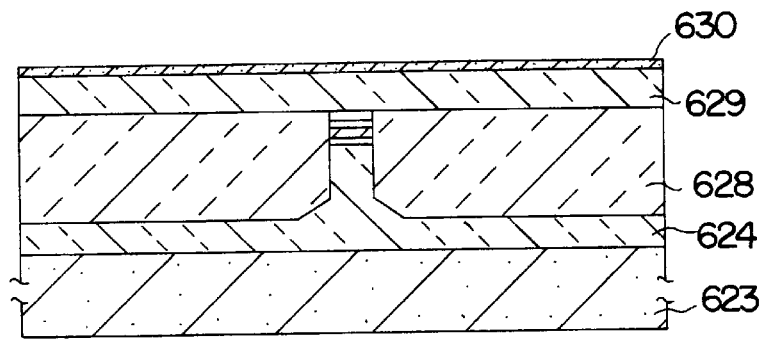

Then, after the silicon oxide film 609 is removed, an n-InP buried layer 629 and an n-InGaAsP contact layer 630 are grown so as to cover the mesa stripe 670 and the current blocking layer 628, thus forming a buried type hetero structure as shown in FIG. 8B.

Figure 8C:
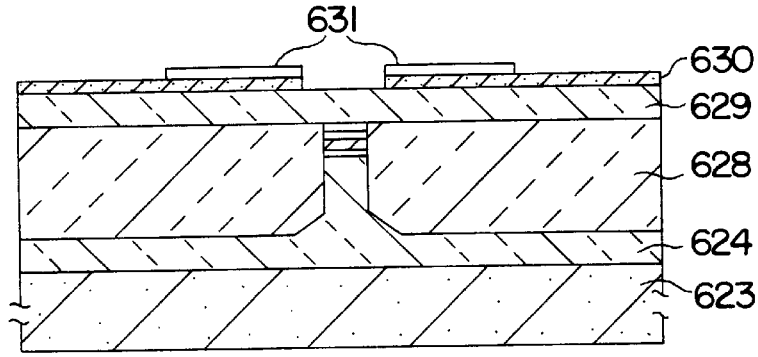

Thereafter, a silicon oxide film with a thickness of about 0.15 $\mu$m is deposited on the contact layer 630. Then, two grooves for forming electrodes are symmetrically formed using a resist with the mesa stripe 670 including the active layer 616 interposed therebetween. Then, the silicon oxide film is removed. Then, an alloy film of gold and tin or an alloy film of gold and germanium is deposited on the contact layer 630. Furthermore, lift-off and annealing at about 350° C. are performed to form two striped n-type electrodes 631, as shown in FIG. 8C.

Furthermore, a resist mask with a suitable pattern is formed, and the regions including the n-type electrodes 631 except the region immediately above the active layer 616 (the mesa stripe 670) are masked. Then, using the mask, the contact layer 630 is etched to provide an opening in a region in the contact layer 630 immediately above the mesa stripe 670.

Figure 8D:
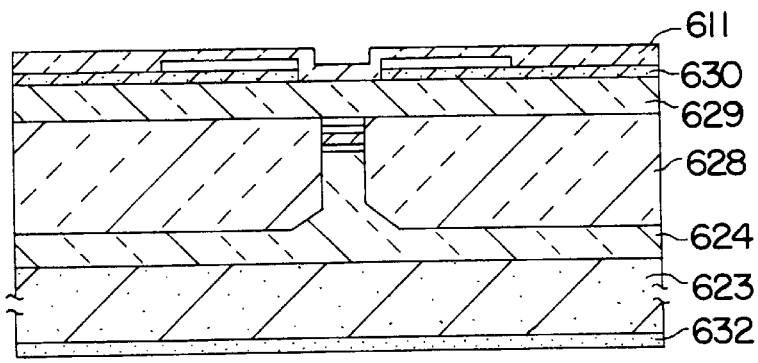
Figure 9:
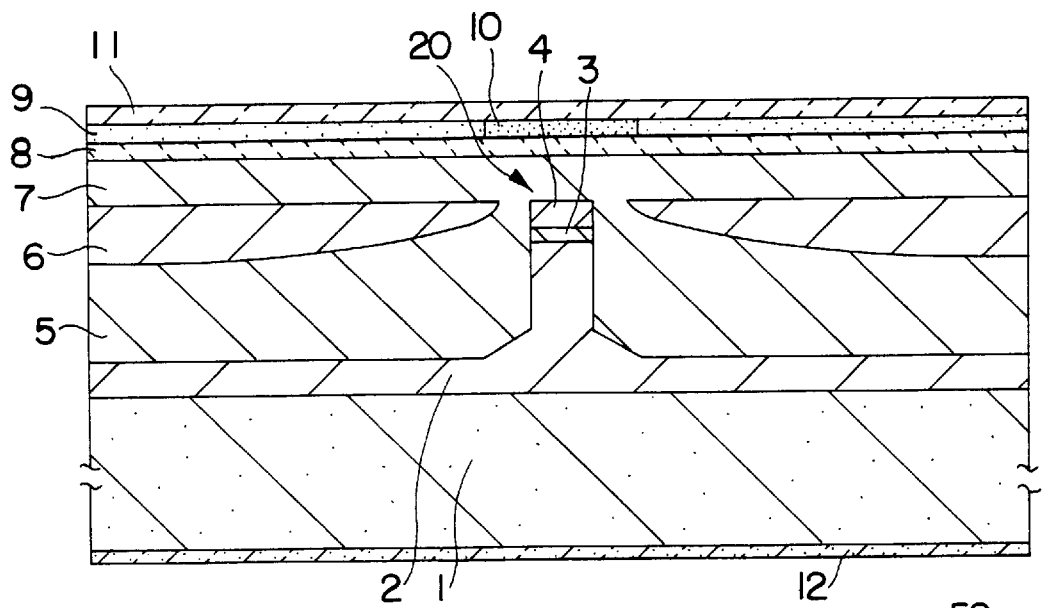
FIG. 9 is a cross sectional views illustrating a structure of a conventional semiconductor laser.
Figure 10:
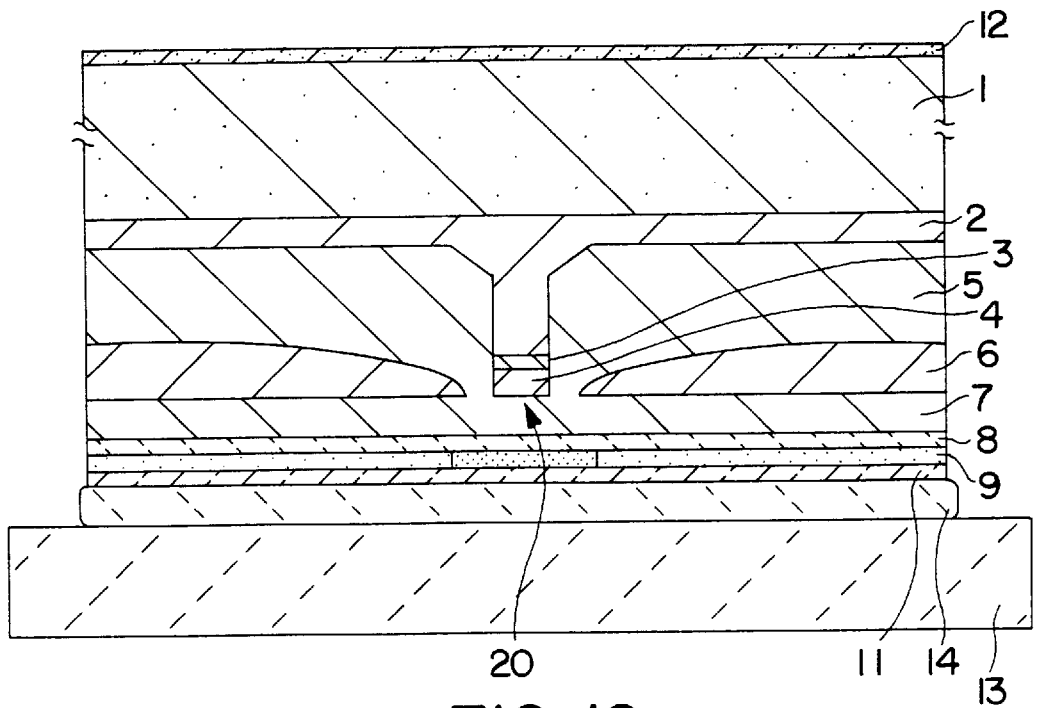
FIG. 10 is a cross sectional view illustrating the state where the conventional semiconductor laser shown in FIG. 9 is attached to a heat sink.

Then, as shown in FIG. 8D, a metal multilayered film 611 formed of titanium, platinum and gold is deposited so as to cover the n-type electrodes 631 and the contact layer 630. Finally, a p-type electrode 632 formed of gold and zinc is formed on the reverse face of the p-InP substrate 623, thus completing the semiconductor laser 600.

The thus produced semiconductor laser 600 is bonded to a heat sink with a soldering material in the same manner as in the cases of the semiconductor lasers of the previous embodiments. As in the previous embodiments, the heat generated inside the semiconductor laser 600 is efficiently released without being shielded by the contact layer or the like. As a result, satisfactory operating characteristics such as little saturation of light output can be realized even during high bias driving.

In the description of the present embodiment, the structure of the semiconductor laser 600 is similar to that of the semiconductor laser 100 of the first embodiment, except that the polarities of p-type and n-type are opposite. It is possible to reverse the polarity of the semiconductor lasers 200, 300, 400 and 500 of the other embodiments to obtain the same effect.

Although the semiconductor lasers of the present invention are formed of an InP type material, the present invention is not limited thereto, but can be applied to the contact structure of a red color laser of AlGaInP type (e.g., AlGaInP), a blue color laser of GaN type (e.g., AlGaInN), or a blue laser of ZnSe type (e.g., ZnMgSSe). When the present invention is applied to the contact structure constituted by a three or four element mixed crystal, the heat release characteristic can be improved.

As described above, according to the present invention, layers made of material having a low thermal conductivity such as an InGaAsP layer, an InGaAs layer or an insulator film such as a silicon oxide film ($SiO_2$) are not formed immediately above the active layer of the semiconductor laser. Thus, even when the semiconductor laser is driven by applying high bias current, the heat generated inside the semiconductor multilayered structure can be efficiently released, thus realizing satisfactory characteristics such as little saturation of light output.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor laser comprising:

a substrate of a first conductive type;

a mesa provided on the substrate and having a multilayered structure including at least a cladding layer of the first conductive type, an active layer and another cladding layer of a second conductive type;

a current blocking layer provided on both sides of the mesa;

a buried layer of the second conductive type provided on the mesa and the current blocking layer; and a contact layer of the second conductive type provided in a predetermined region on the buried layer, wherein the predetermined region does not include a portion immediately above the mesa.

2. A semiconductor laser according to claim 1 further comprising a metal layer provided in a region on the buried layer and where the contact layer is not provided.

3. A semiconductor laser according to claim 2, wherein the metal layer is constituted by an element preventing a metal element forming a soldering material from entering the buried layer.

4. A semiconductor laser according to claim 1 further comprising a non-alloy electrode provided on the buried layer and the contact layer.

5. A semiconductor laser according to claim 4, wherein the non-alloy electrode is constituted by a layer including platinum.

6. A semiconductor laser according to claim 1, wherein a semiconductor layer having a satisfactory thermal conductivity is provided in a region on the buried layer and where the contact layer is not provided.

7. A semiconductor laser according to claim 6, wherein a thickness of the semiconductor layer is set to a value leaking from the active layer, and showing a sufficient heat release effect.

8. A semiconductor laser according to claim 1, wherein a width of a region where the contact layer is not provided is set to a value about twice or more and about ten times or less the width of the mesa.

9. A semiconductor laser according to claim 1, wherein a concave portion is provided in a region on the substrate immediately below the mesa, and a layer made of a material with a high thermal conductivity is provided in the concave portion.

10. A semiconductor laser according to claim 9, wherein the layer made of the material with a high thermal conductivity is a metal layer.

* * * * *

UNITED STATES PATENT AND TRADE MARK OFFICE
CERTIFICATE OF CORRECTION

PATENT NO.   : 5,949,808
DATED        : September 7, 1999
INVENTOR(S)  : Fujihara et al.

It is certified that error appears in the above-identified patent and that said Letters Patent is hereby corrected as shown below:

Column 12, line 40, after "value" insert --showing sufficient confinement with respect to light--.

Signed and Sealed this

Seventeenth Day of April, 2001

Attest:

NICHOLAS P. GODICI

Attesting Officer    Acting Director of the United States Patent and Trademark Office